US009332341B2

(12) United States Patent
Okabayashi

(10) Patent No.: US 9,332,341 B2
(45) Date of Patent: May 3, 2016

(54) AUDIO SIGNAL PROCESSING SYSTEM AND RECORDING METHOD

(71) Applicant: Yamaha Corporation, Hamamatsu-shi, Shizuoka-ken (JP)

(72) Inventor: Masaaki Okabayashi, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 352 days.

(21) Appl. No.: 13/745,621

(22) Filed: Jan. 18, 2013

(65) Prior Publication Data

US 2013/0188810 A1 Jul. 25, 2013

(30) Foreign Application Priority Data

Jan. 23, 2012 (JP) ................................ 2012-010827

(51) Int. Cl.

| | |
|---|---|
| ***H04B 1/00*** | (2006.01) |
| ***H04R 3/00*** | (2006.01) |
| ***H04H 60/04*** | (2008.01) |
| *H03G 3/00* | (2006.01) |

(52) U.S. Cl.

CPC . *H04R 3/00* (2013.01); *H04H 60/04* (2013.01)

(58) Field of Classification Search

CPC ....... H04H 60/04; H04H 20/12; H04H 20/26; H04R 2420/01; H04R 3/005; H04S 1/007; H04S 3/00; H04S 7/00; G10H 1/36

USPC .......................................................... 381/119

See application file for complete search history.

(56) References Cited

U.S. PATENT DOCUMENTS

2008/0156179 A1* 7/2008 Eastman ................ H04H 60/04 84/645

FOREIGN PATENT DOCUMENTS

JP 2007-293312 A 11/2007

OTHER PUBLICATIONS

Anonymous: "Digital Mixing Studio 01X Owner's manual", Internet Citation, Jan. 1, 2003, pp. 1-156, XP002588171.*

Operation Manual. (Nov. 18, 2009). "Cubase LE5 Music Production System," Steinberg Media Technologies, 270 pages.

Anonymous. (Jan. 1, 2003). "Digital Mixing Studio 01X Owner's manual," Yamaha, Retrieved from the Internet, located at: URL:http://www2. yamaha.co.jp/manual/pdf/emi/english/synth/01x_en_om.pdf, retrieved on Jun. 21, 2010, pp. 1-156, XP002588171.

Extended European Search Report mailed Jul. 14, 2014, for EP Application No. 13152006.6, nine pages.

* cited by examiner

*Primary Examiner* — Vivian Chin
*Assistant Examiner* — Ammar Hamid
(74) *Attorney, Agent, or Firm* — Morrison & Foerster LLP

(57) ABSTRACT

A processing apparatus communicatively connected with a mixer apparatus and having an audio recording function is capable of recording in real time audio signals of one or more channels output from the mixer apparatus. When a snapshot change is to be made for collectively changing a state of a set of signal-processing setting data, the mixer apparatus transmits, to the processing apparatus, a command for setting a given parameter. Upon receipt of the command, the processing sets and records the given parameter, instructed by the received command, into a project that is recording in real time the audio signals of one or more channels.

14 Claims, 7 Drawing Sheets

| No. | SNAPSHOT MAME |
|---|---|
| 1 | OPENING |
| 2 | MC1 |
| 3 | 1ST MUSIC PIECE |
| 4 | 2ND MUSIC PIECE |
| ... | ... |

AUDIO SIGNAL PROCESSING SYSTEM AND RECORDING METHOD

BACKGROUND

The present invention relates an audio signal processing system and recording method which can record, via an audio signal processing apparatus (DAW), audio signals output from a mixer.

In applications of PA (Public Addressing) equipment that is broadcast equipment for transmitting sound information to many people in a facility, school or the like and in applications of SR (Sound Reinforcement) equipment that is broadcast equipment for transmitting, with uniform sound quality, performance sounds and vocal sounds to every inch of even a concert venue or other large venue, it has been conventional to pick up musical instrument performance sounds, vocal sounds and speech voices produced in a live event, mix these picked-up sounds and send the mixed sounds to power amplifiers and various recording equipment, effecters and human players executing a music performance. Generally, the conventionally-known mixers include: an I/O unit having input ports for inputting audio signals picked up by microphones and/or output from a synthesizer and output ports for outputting digital and analog audio signals; an audio signal processing unit for performing mixing processing and effect processing on digital audio signals; and a console for a user to adjust, through operation of various panel operators, a performance into a state that appears to most suitably express the performance. Amplifiers are connected to the output ports from which are output analog audio signals of the mixer, and a plurality of speakers installed in a venue are connected to the amplifiers so that audio signals amplified by the amplifiers are audibly generated or sounded through the speakers.

Further, in conventional applications of PA/SR systems, audio signals of individual channels output from a mixer are recorded onto different tracks by use of a MTR (Multi Track Recorder). Thus, in music production, sounds of various musical instruments, such as a drum, bass, guitar and piano, and vocals recorded separately can be adjusted in their respective volume and pan, an effect can be imparted to the vocals, and a different effect can be imparted for each of the musical instruments. Thus, desired music production can be performed by finely adjusting sound quality of the individual audio signals after the recording.

Further, in audio signal processing apparatus employing a general-purpose computer, it has been known to perform, through digital signal processing, audio processing, such as performance data recording and editing and mixing. Such audio signal processing apparatus are implemented by installing an application program called "DAW software" into the computer, and thus, these audio signal processing apparatus are often called "digital audio workstations" or "DAWs". Because real-time recording is today possible thanks to an improvement of the DAW function and because the computer on which the DAW runs has a good portability, it has become popular, in the field of PA/SR systems, to perform real-time recording of audio signals of individual channels of a mixer by use of the DAW in place of the MTR.

Because the PA/SR system and recording system are often designed and operated independently of each other, necessary work from setting through to operation is normally performed separately in each of the PA/SR system and recording system. In the conventionally-known DAWs, it has been known to minimize time and labor involved in setting, from the beginning, configuration of tracks for each project by storing in advance configuration information of the tracks as a template and starting a new project with the template prestored in a program. One example of such a technique is disclosed in "Steinberg Media Technologies GmbH CUBASE LE5 Operation Manual" pp. 9-12 available online from the Internet at <http://www.zoom.co.jp/archive/Japanese_Manual/CubaseLE5_Operation_Manual_jp.pdf>

Further, even after the mixer and the DAW are connected with each other, control is performed separately in each of the interconnected apparatus (i.e., the mixer and the DAW). For example, a parameter change in the mixer and a parameter change in the DAW are manipulated basically independently of each other. Note, however, that values of parameters of the DAW software, such as channel-specific parameters like reproduction, stop, level and mute, can be changed individually from an external controller.

Furthermore, with some of the conventionally-known DAWs, it has been contemplated to, when a project file including identification information and parameters of external equipment already set for use has been read into the DAW, detect external music equipment currently connected to a communication network, then associate the detected external equipment with the external equipment already set for use at the time of storage of the project file and then transmit parameters, stored in a parameter storage device, to the external music equipment that could be associated. In this way, it is possible to synchronize parameters between the external equipment and the parameter storage device and thereby restore, for the music equipment that could be associated, a music function available at the time of the storage of the project file (see Japanese Patent Application Laid-open Publication No. 2007-293312).

Furthermore, when audio signals of individual channels of a mixer are to be recorded in real time by use of the DAW, it is customary to individually set parameters of types that are not recorded in interlocked relation to recording of the audio signals. Particularly, for a particular type of parameter called "marker" (editing point), it is usual for a recording engineer parameter to manually put the markers at appropriate points while listening to already-recorded data after the end of a live event. Thus, the longer the time of the live event, the more bothersome would become the marker putting operation. Consequently, there has been the problem that setting of parameters would require much time and labor.

SUMMARY OF THE INVENTION

In view of the foregoing prior art problems, it is an object of the present invention to provide an improved audio signal processing system which can readily set a parameter of a given type at the time of real-time recording.

In order to accomplish the above-mentioned object, the present invention provides an improved audio signal processing system, which comprises: a mixer apparatus; and a processing apparatus communicatively connected with the mixer apparatus and having an audio recording function, the processing apparatus being configured to be capable of recording in real time audio signals of one or more channels output from the mixer apparatus. The mixer apparatus is configured to transmit, to the processing apparatus, a command for setting a given parameter when a snapshot change is to be made for collectively changing a state of a set of signal-processing setting data, and the processing apparatus is configured to, upon receipt of the command, set the given parameter, instructed by the received command, into a project that is recording in real time the audio signals of one or more channels.

According to the present invention, when a snapshot change has been made in the mixer apparatus, a command for setting a given parameter is transmitted from the mixer apparatus to the processing apparatus. Upon receipt of the command from the mixer apparatus, the processing apparatus automatically sets the given parameter, instructed by the received command, into a project (i.e., recording project) that is recording in real time audio signals of one or more channels. With such arrangements, setting of the given parameter (such as a marker) can be made with ease during the real-time recording.

The present invention may be constructed and implemented not only as the apparatus invention discussed above but also as a method invention. Also, the present invention may be arranged and implemented as a software program for, execution by a processor, such as a computer or DSP, as well as a non-transitory storage medium storing such a software program. In this case, the program may be provided to a user in the storage medium and then installed into a computer of the user, or delivered from a server apparatus to a computer of a client via a communication network and then installed into the client's computer. Further, the processor used in the present invention may comprise a dedicated processor with dedicated logic built in hardware, not to mention a computer or other general-purpose processor capable of running a desired software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Figure 1:
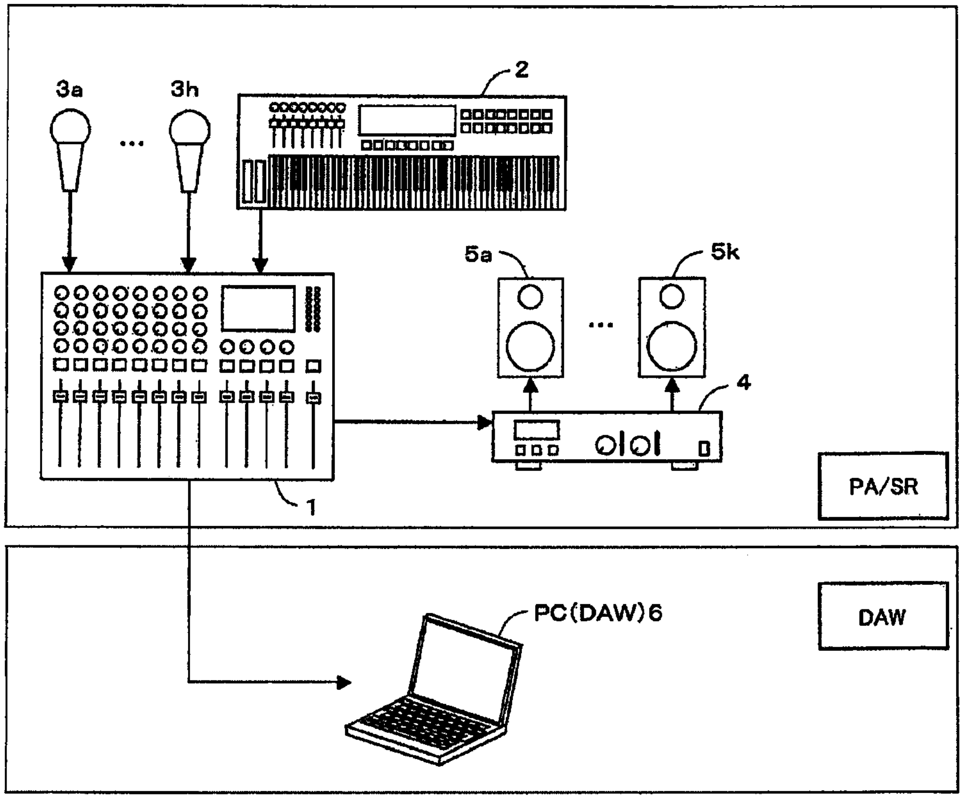
FIG. 1 is a schematic block diagram showing an example construction of an audio signal processing system according to an embodiment of the present invention.

FIG. 1 is a schematic block diagram showing an example construction of an audio signal processing system according to an embodiment of the present invention. The audio signal processing system shown in FIG. 1 comprises a PA/SR system, and a recording system connected to the PA/SR system. The PA/SR system includes: a mixer 1 to which are input analog audio signals from a plurality of microphones 3_a_, . . . , 3_h_ installed in a venue or the like and digital audio signals from a synthesizer 2; an amplifier unit 4 for amplifying mixed audio signals output from the mixer 1; and a plurality of speakers 5_a_, . . . , 5_k_ for audibly generating or sounding amplified audio signals output from the amplifier 4. The recording system comprises a personal computer (PC) 6 having installed therein DAW (digital audio workstation) software. By operation of the DAW, the personal computer (PC) 6 functions as a processing apparatus having an audio recording function.

The mixer 1 includes a plurality of input channels for inputting audio signals, a plurality of mixing buses for mixing the input audio signals, and a plurality of output channels for outputting the mixed audio signals from the input channels. Each of the input channels controls frequency characteristics, mixing level, etc. of the corresponding input audio signal and outputs the thus-controlled signal to individual ones of the mixing buses, and each of the mixing buses mixes the audio signals input from the input channels and then outputs the mixed audio signals to corresponding ones of the output channels. The PC (DAW) 6 assigns the audio signals of the individual input channels, output from the mixer 1, to individual tracks of a project (i.e., recording project) so that it can record the audio signals onto the tracks in real time. Audio signals output from the mixer 1 to the PC (DAW) 6 at the time of the real-time recording include direct-out audio signals output directly from predetermined pre-fader positions (i.e., positions preceding level-adjusting faders) of the input channels via output ports, and post-fader signals output from post-fader portions of the input channels. The audio signals output from the mixer 1 can be set in the mixer 1.

Figure 2:
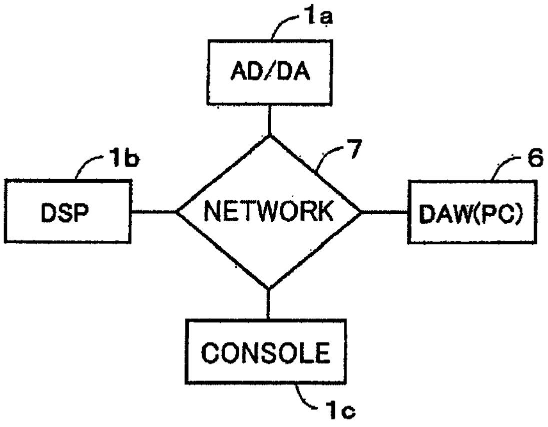
FIG. 2 is a schematic block diagram showing an audio signal processing system according to another embodiment of the present invention.

FIG. 2 is a schematic block diagram showing an audio signal processing system according to another embodiment of the present invention. The audio signal processing system shown in FIG. 2 includes an audio network 7, such as the Ethernet (registered trademark). To the audio network 7 are connected an AD/DA section 1_a_, a signal processing section (DSP section) 1_b_, a console section 1_c_, and the PC (DAW) 6 that is an audio signal processing apparatus with an audio recording function. The AD/DA section 1_a_ includes physical input ports that are input terminals for connection thereto microphones and a synthesizer, physical output ports that are output terminals for connection thereto amplifiers etc., and a communication I/O terminal for connection to the audio network 7. The AD/DA section 1_a_ further includes an A/D converter for converting a plurality of analog signals, input to analog input ports, into digital signals and outputting the converted digital signals from input ports, and a D/A converter for converting a plurality of digital signals, supplied to an analog output port section, into analog output signals and outputting the converted analog signals from analog output ports. Further, the DSP section 1_b_, which performs mixing and effect processing, comprises a multiplicity of DSPs (Digital Signal Processors) and includes a communication I/O terminal for connection to the audio network 7.

The console section 1*c* includes a plurality of electric faders provided on a console panel for adjusting respective send levels, to the mixing buses, of the input channels, a multiplicity of operators (operating members) for manipulating various parameters, and a communication I/O terminal for connection to the audio network 7. By operating the electric faders and operators (operating members), a user or human operator operating the console section 1*c* adjusts volumes and colors of audio signals of musical instrument performance sounds and vocals to a state that appears to most suitably express a performance. The PC (DAW) 6 is the audio signal processing apparatus which has the DAW software installed therein and in which the DAW runs. The PC (DAW) 6 includes a communication I/O terminal for connection to the audio network 7, and it implements audio signal processing functions, such as recording and reproduction of audio signals, effect impartment and mixing.

A mixer similar to the mixer 1 of FIG. 1 is implemented by the above-mentioned AD/DA section 1*a*, DSP section 1*b* and console section 1*c* being logically connected to the audio network 7. When real-time recording of audio signals of individual channels of the thus-implemented mixer is to be performed by the DAW running in the PC (DAW) 6, the DAW can take out signals at any desired positions of the mixer, which comprises the above-mentioned AD/DA section 1*a*, DSP section 1*b* and console section 1*c*, by logically connecting to the desired positions, because the PC (DAW) 6 is logically connected to the mixer via the audio network 7. Namely, in the other embodiment of the audio signal processing system of the invention, a direct out signal, post-fader signal, etc. of the input channels can be recorded into the DAW by being set by the PC (DAW) 6.

In recording audio signals of individual channels output from the mixer shown in FIG. 1 or 2, the DAW running in the PC (DAW) 6 creates a project and record the audio signals of the individual channels onto tracks of the thus-created project. The number of the tracks of the project is at least equal to the number of the channels of the mixer, so that the individual channels are assigned to respective ones of the tracks. In this case, it is preferable that channels names of the channels be set as track names of the corresponding tracks.

Figure 3:
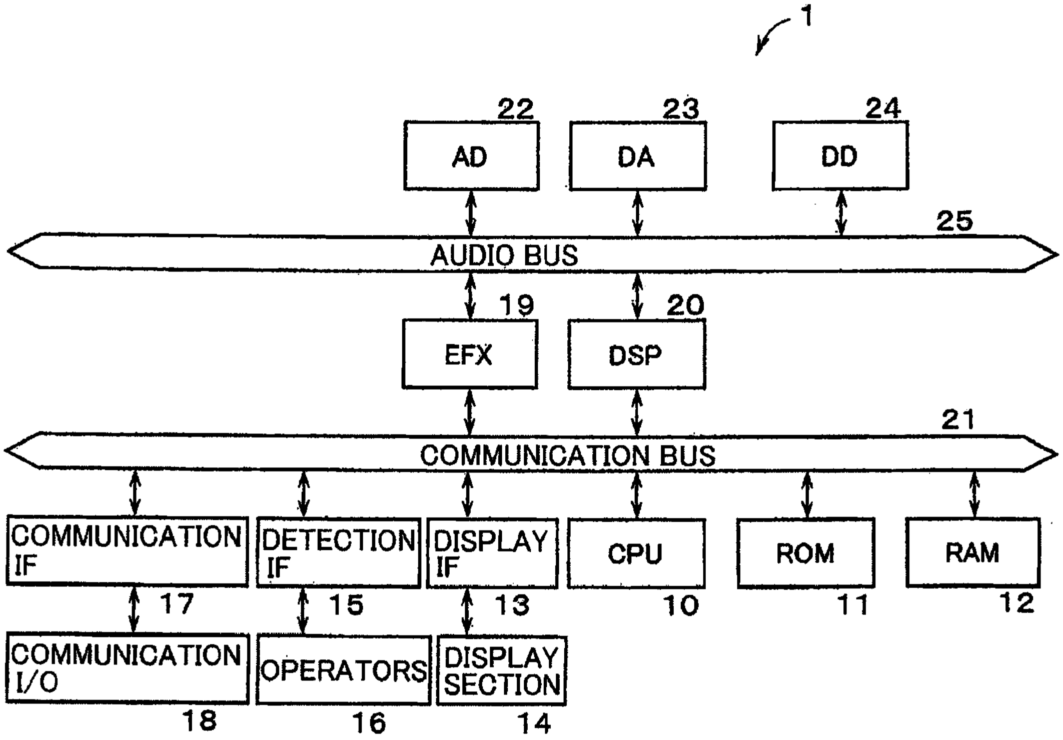
FIG. 3 is a schematic block diagram showing an example hardware construction of a mixer constituting the audio signal processing system of the present invention.

FIG. 3 is a schematic block diagram showing an example hardware construction of the mixer 1 shown in FIG. 1. Note that a hardware construction of the mixer implemented by the other embodiment of the audio signal processing system shown in FIG. 2 is equivalent to the hardware construction shown in FIG. 3.

In the mixer 1 shown in FIG. 3, a CPU (Central Processing Unit) 10 executes a management program (i.e., operating system or OS) to control general operation of the mixer 1 on the OS. The mixer 1 includes a non-volatile ROM (Read-Only Member) 11 having stored therein operating software, such as control programs for execution by the CPU 10, and a RAM (Random Access Memory) for storing therein a working area of the CPU 10, various data, etc. Further, the CPU 10 executes a control program to perform mixing processing with a DSP 20 performing audio signal processing on a plurality of input audio signals. By using a rewritable ROM, such as a flash memory, as the ROM 11 rewriting of the operating software is permitted, so that version upgrade of the operating software can be effected with ease. Under the control of the CPU 10, the DSP 20 performs audio signal processing where it mixes input audio signals after adjusting volume levels and frequency characteristics of the input audio signals are adjusted on the basis of predetermined parameters and controls audio characteristics, such as volume, pan and effect, of the mixed audio signals are controlled on the basis of respective parameters. Further, in FIG. 3, an effecter (EFX) 19 imparts effects, such as reverberation, echo and chorus, to the mixed audio signals.

Further, in FIG. 3, a display IF 13 is a display interface for displaying, on a display section 14 like a liquid crystal display, various screens related to the audio signal processing. A detection IF 15 constantly scans various operators 16, such as faders, knobs and switches, to detect user's operation of the operators 16, and editing and manipulation of parameters to be used in the audio signal processing can be performed on the basis of a signal indicative of the detected operation (i.e., operation detection signal). A communication IF 17 is an interface for performing communication with external equipment via a communication I/O 18; for example, the communication IF 17 is a network interface, such as Ethernet (registered trademark) or the like. The above-mentioned CPU 10, ROM 11, RAM 12, display IF 13, detection IF 15, communication IF 17, EFX 19 and DSP 20 communicate data etc. with one another via a communication bus 21.

The EFX 19 and DSP 20 communicate data etc. with an AD 22, a DA 23 and a DD 24, constituting an input/output section, via an audio bus 25. The AD 22 includes one or more physical input ports that are input terminals for inputting analog audio signals, and analog audio signals input to the input ports are converted into digital audio signals and then sent to the audio bus 25. The DA 23 includes one or more physical output ports that are output terminals for outputting mixed signals to the outside, and digital audio signals received by the DA 23 via the audio bus 25 are converted into analog audio signals and then output from the output ports; more specifically, the converted analog audio signals are audibly output through speakers disposed in a venue or on a stage and connected to the output ports. The DD 24 includes one or more physical input ports that are input terminals for inputting digital audio signals and one or more physical output ports that are output terminals for outputting mixed digital audio signals to the outside. Digital audio signals input to the input ports of the DD converter 24 are sent to the audio bus 25, and digital audio signals received via the audio bus 25 are output from the output ports of the DD converter 24 and then supplied to a recording system or the like connected to the output ports. Note that the digital audio signals sent from the AD 22 and DD 24 to the audio bus 25 are received by the DSP 20 so that the above-mentioned digital signal processing is performed on the received digital audio signals. The digital audio signals mixed by and sent from the DSP 20 are received by the DA 23 or DD 24.

Figure 4:
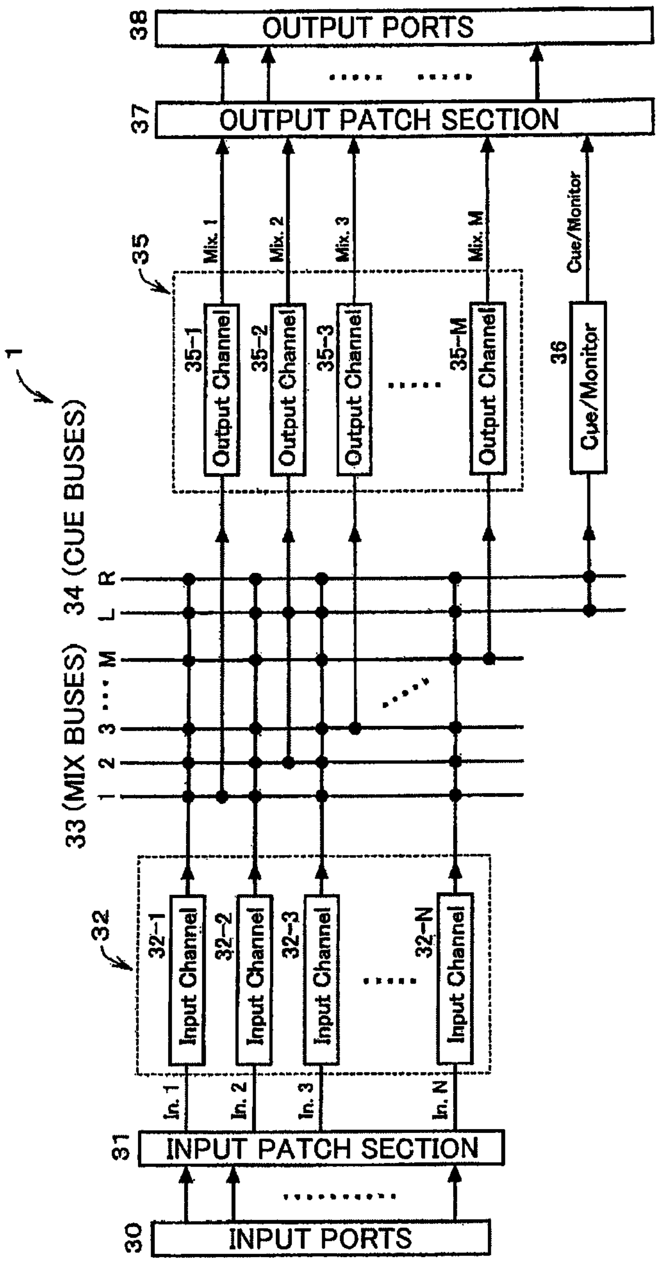
FIG. 4 is a schematic block diagram showing a processing algorithm of the mixer constituting the audio signal processing system of the present invention.

FIG. 4 is a schematic block diagram equivalently showing a processing algorithm of the mixer 1. In FIG. 4, digital audio signals supplied via a plurality of input ports 30 are input to an input patch section 31. The input ports 30 are physical input terminals provided in the AD 22 and DD 24. The input patch section 31 selectively patches (connects) the plurality of physical input ports, which are audio signal input sources, to N (N is an integral number equal to or greater than one, such as ninety-six (96)) logical input channels 32-1, 32-2, 32-3, . . . , 32-N provided in an input channel section 32. In this case, each of the input ports can be patched to two or more input channels, but only one input port can be patched to each of the input channels. To the input channels 32-1, 32-2, 32-3, . . . , 32-N are supplied audio signals In.1, In.2, In. 3, . . . , In.N from the input ports 30 patched by the input patch section 31. Audio characteristics of the audio signals In.1, In.2, In.3, . . . , In.N input to the input channels 32-1, 32-2, 32-3, . . . , 32-N are adjusted in the input channels 32-1, 32-2, 32-3, . . . , 32-N. Namely, each of the audio signals input to the input channels 32-1, 32-2, 32-3, . . . , 32-N in an input channel section 32 (i.e., each input channel signal) is not only adjusted in audio characteristic by an equalizer and compressor but also controlled in send level. The audio signals thus adjusted and controlled are sent to M (M is an integral number equal to or greater than one) mixing buses (Mix Buses) 33 and L (Lest) and R (Right) stereo cue buses 34. In this case, the N input channel signals output from the input channel section 32 are each selectively output to one or more of the M mixing buses 33.

In each of the M mixing buses 33, one or more input channel signals selectively input from selected ones of the N input channels are mixed; thus, a total of M different mixed audio signals are output from the mixing buses 33. The mixed audio signal output from each of the M mixing buses 33 is supplied to a respective one of M output channels 35-1, 35-2, 35-3, . . . , 35-M of an output channel section 35. In each of the output channels 35-1, 35-2, 35-3, . . . , 35-M, the supplied mixed audio signal is adjusted in audio characteristic, such as frequency balance, by an equalizer and compressor. Thus, the thus-adjusted audio signals are output from the output channels 35-1, 35-2, 35-3, . . . , 35-M as output channel signals Mix.1, Mix.2, Mix.3, . . . , Mix.M. Such M output channel signals Mix.1 to Mix.M are supplied to an output patch section 37. Further, in each of the L and R cue buses 34, cuing/monitoring signals obtained by mixing of one or more input channel signals input from the N input channels are output to a cue/monitor section 36. Cue/monitor outputs obtained by adjusting audio characteristics, such as frequency balance, of the signals by an equalizer and compressor in the cue/monitor section 36 is supplied to the output patch section 37.

The output patch section 37 is capable of selectively patching (connecting) any one of the M output channel signals Mix.1 to Mix.M from the output channel section 35 and cue/monitor outputs from the cue/monitor section 36 to any one of a plurality of output ports 38. Namely, an output channel signal patched by the output patch section 37 is supplied to any one of the output ports 38. In each of the output ports 38, the digital output channel signal is converted into an analog output signal. Such converted analog output signals are amplified via amplifiers, connected to the patched-to output ports 38, to be sounded through a plurality of speakers installed in the venue. Further, the analog output signals from the output ports 38 may be supplied to in-ear monitors attached to musicians etc. on the stage, and reproduced through stage monitor speakers disposed near the musicians. In addition, the digital analog signals from the output ports 38 patched to by the output patch section 37 can be supplied to a recording system, DAT etc. connected to the output ports 38, for digital recording therein. Furthermore, the cue/monitor output is converted into an analog audio signal and then can be audibly output, via the output port 38 patched to by the output patch section 37, through monitoring speakers disposed in an operator room or headphones worn by human operators for test-listening purposes. Namely, the output patch section 37 selectively patches the output channels, which are logical channels, to the output ports which are physical output terminals. Although not particularly shown, a direct-out configuration is realized by the output patch section 37 patching predetermined positions of the input channels 32-1 to 32-N to the output ports 38.

Figure 5:
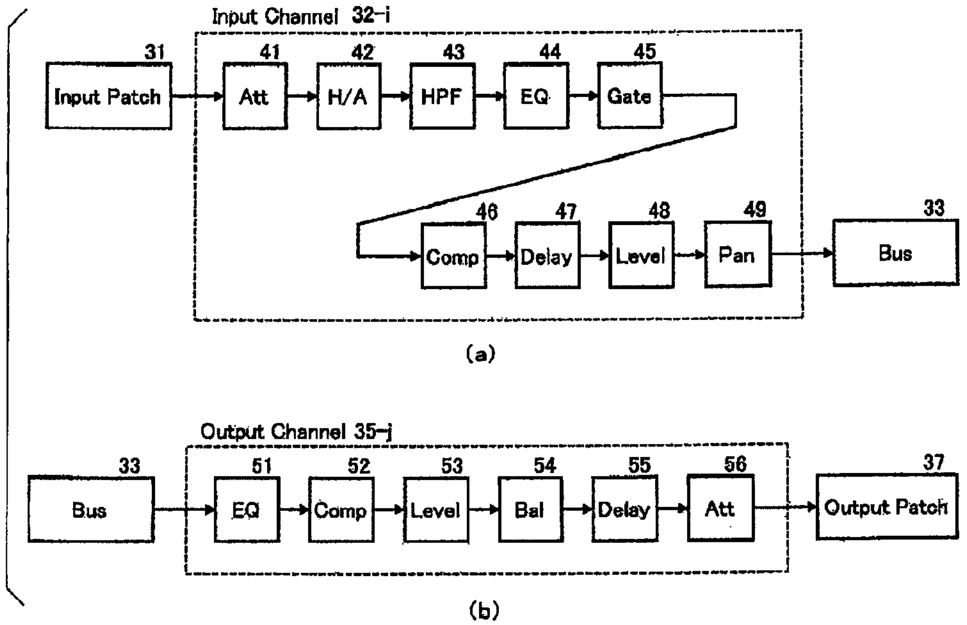
FIG. 5 is a circuit diagram showing example constructions of input channels and output channels constituting the audio signal processing system of the present invention.

All of the input channels 32-1 to 32-N in the input channel section 32 shown in FIG. 4 are constructed identically to one another, and (a) of FIG. 5 shows a construction of a representative one of the input channels 32-*i*. Any one of the input ports is patched by the input patch section 31 to the input channel 32-*i* shown in (a) of FIG. 5. The input channel 32-*i* comprises a cascade connection of an attenuator (Att) 41, head amplifier (H/A) 42, high pass filter (HPF) 43, equalizer (EQ) 44, noise gate (Gate) 45, compressor (Comp) 46, delay 47, fader (Level) 48 and pan 49. The attenuator 41 adjusts an attenuation amount of a digital audio signal input to the input channel 32-*i*, and the head amplifier 42 amplifies the input digital audio signal. The high pass filter 43 cuts off a frequency range of the input digital audio signal lower than a particular frequency. The equalizer 44 adjusts frequency characteristics of the input digital audio signal; for example, the equalizer 44 can change the frequency characteristics of the digital audio signal for each of four bands, i.e., high (HI), high-middle (HI MID), low-middle (LOW MID) and low (LOW) bands.

The noise gate 45 is a gate for cutting off noise; more specifically, when the level of the input digital audio signal has fallen below a predetermined reference value, the noise gate 45 cuts off noise by rapidly lowering a gain of the input digital audio signal. The compressor 46 narrows a dynamic range of the input digital audio signal and thereby prevents saturation of the input digital audio signal. The delay 47 delays the input digital audio signal in order to compensate for a distance between a sound source and a microphone connected to the input port patched to the input channel 32-*i*. The fader 48 is a level change means, such as an electric fader, for controlling a send level from the input channel 32-*i* to any one of the mixing buses 33. Further, the pan 49 adjusts left-right localization of signals sent from the input channel 32-*i* to two stereo mixing buses 33.

The digital audio signal output from the input channel 32-*i* can be supplied not only to tow or more desired mixing buses 33 but also to the cue buses 34. Note that a direct-out position at which the digital audio signal can be sent from the mixer directly to the PC (DAW) 6 can be selected from among a position immediately preceding the attenuator 41, a position immediately preceding the high pass filter 43, a position immediately preceding the fader 48, etc.

Further, all of the output channels 35-1 to 35-N in the output channel section 35 shown in FIG. 4 are constructed identically to one another, and (b) of FIG. 5 shows a construction of a representative one of the output channels 35-*i*.

To the output channel 35-*i* shown in (b) of FIG. 5 is input a mixed output (mixed audio signal) from the jth mixing bus 33. The output channel 35-*i* comprises a cascade connection of an equalizer (EQ) 51, compressor (Comp) 52, fader (Level) 53, balance (Bal) 54, delay 55 and attenuator (Att) 56. The equalizer 51 adjusts frequency characteristics of a digital audio signal to be output; for example, the equalizer 51 can change frequency characteristics of the digital audio signal for each of six frequency bands, i.e. high (Hi), high-middle (HI MID), middle (MID), low-middle (LOW MID), low (LOW), and sub middle (SUB MID) bands. The compressor 52 narrows a dynamic range of the digital audio signal to be output and thereby prevents saturation of the digital audio signal to be output. The fader 53 is a level change means, such as an electric fader, for controlling an output level from the output channel 35-*j* to the output patch section 37. Where the output channel 35-*i* is set as a stereo output channel, the balance 54 adjusts left-right volume balance. The delay 55 delays the digital audio signal to be output in order to effect distance compensation for a speaker and localization compensation, and the attenuator 56 adjusts an attenuation amount of the digital audio signal to be output.

A signal processing section in each of the input channel 32-*i* and output channel 35-*j* of the mixer 1 performs signal processing in accordance with a parameter set comprising a plurality of signal processing parameters set via operators, such as a fader, knob and switch, provided on the panel. Thus, when an audio output from the mixer 1 is sounded, audio settings corresponding to the parameter set are created. In the present invention, a set of audio settings thus created is referred to as "snapshot", and a parameter set realizing a snapshot is referred to also as snapshot data. Such a snapshot corresponds to a scene in conventionally-known mixers, and the snapshot data is also a set of setting data for signal processing in the mixer 1. Further, a "snapshot change" means changing a snapshot set in the mixer 1, i.e. collectively changing a state of a set of signal-processing setting data (a plurality of parameters) to another. When a snapshot change is to be made, recall operation is performed designating a desired snapshot from among a plurality of snapshots registered (stored) in a memory, in response to which snapshot data of the designated snapshot (replacing snapshot) is read out from the memory so that audio settings corresponding to the read-out snapshot are reproduced in the mixer 1. In this way, a desired snapshot change can be made. By prestoring, in a memory, various snapshots of conference rooms, meeting rooms, banquet rooms, mini theaters, multipurpose halls, etc. and subsequently reading out a desired snapshot (i.e., snapshot desired to be reproduced) from among the preset snapshots, the desired snapshot can be reproduced. Further, by preparing in advance of snapshots corresponding to an opening music piece, first music piece, second music piece, etc. and by, when a desired one of the music pieces is to be performed, changing to the snapshot prepared for the desired music piece, it is possible to change to an audio setting state corresponding to the desired music piece.

Figure 6:
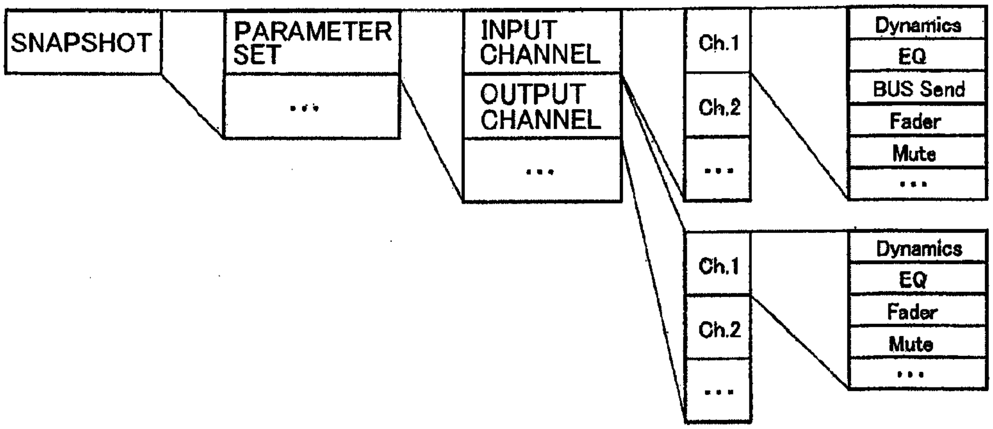
FIG. 6 is a block diagram showing an example data structure of snapshot data in the mixer constituting the audio signal processing system of the present invention.

FIG. 6 is a block diagram showing an example data structure of the snapshot data. As shown, the snapshot data comprises a plurality of parameter sets each including, among other things, parameters of input channels and parameters of output channels. The input channel parameters include parameters of a preset number of input channels Ch.1, Ch.2, . . . . The parameters of each of the input channels include parameters of dynamics, equalizer (EQ), send levels to mixing buses (Bus Send), fader, mute-ON/OFF, etc. Further, the output channel parameters include parameters of a preset number of output channels Ch.1, Ch.2, . . . . The parameters of each of the output channels include parameters of dynamics, equalizer (EQ), fader, mute-ON/OFF, etc.

Figure 7:
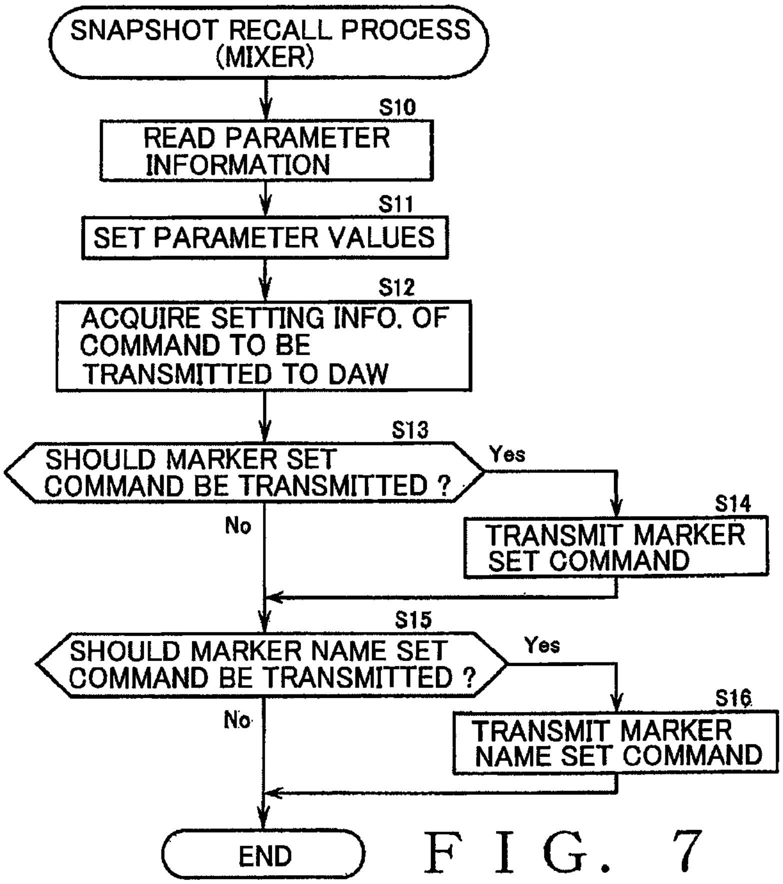
FIG. 7 is a flow chart of a snapshot recall process performed in the mixer constituting the audio signal processing system of the present invention.

FIG. 7 is a flow chart of a snapshot recall process performed when a snapshot change is to be made in the mixer of FIG. 1 or 2 in the audio signal processing system of the present invention. The snapshot recall process of FIG. 7 is started up in response to detection of each snapshot change in the mixer. For example, the snapshot recall process is started up in response to each snapshot change event generated at start timing of any one of the opening music piece, first music piece, second music piece, . . . . Once the snapshot recall process is started up, snapshot data designated in a snapshot recall event at step S10 is read out at step S11, and parameter sets of the read-out snapshot are set into a current memory provided in the RAM 12. Thus, the signal processing parameter values, such as those of faders, knobs and switches, of the mixer are set at parameter values of the snapshot readout at step S11, so that the audio setting state is changed to a designated audio setting state. Then, at step S12, setting information of a command to be transmitted to the PC (DAW) 6 is acquired. The user can set a setting of the command (i.e., settings of the parameters to be transmitted as the command) as desired using a parameter setting window 60 shown in FIG. 8. In the instant embodiment, a marker and a marker name are prepared as given types of parameters that can be transmitted as a command. Namely, using the parameter setting window 60, the user can make a setting or selection for transmitting such marker and marker name parameters as the command. A parameter to be transmitted as a command is set by turning on radio button "Enable" provided beside the parameter, while a parameter to be not transmitted as a command is set by turning on radio button "Disable" provided beside the parameter. On the parameter setting window 60 of FIG. 8, both of the marker and marker name parameters have been set to be transmitted as a command. Once an "OK" button 60*b* in a lower portion of the parameter setting window 60 is clicked, the settings are updated with the settings shown on the parameter setting window 60. On the other hand, once a "Cancel" button 60*a* in the lower portion of the parameter setting window 60 is clicked, the settings shown on the parameter setting window 60 are canceled, so that the previous settings are maintained.

Figures 8, 9:
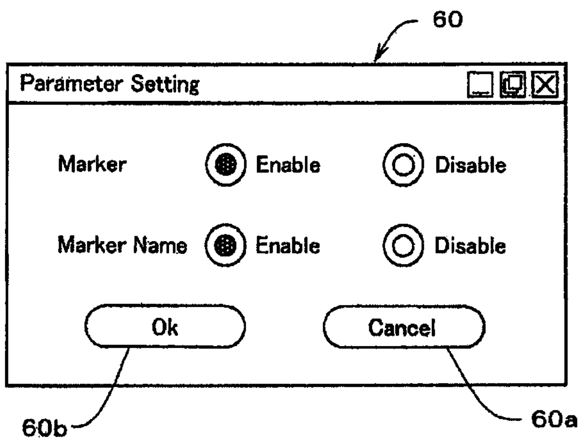
FIG. 8 is a diagram showing a parameter setting window displayed in the mixer for setting parameters for which a command is to be transmitted.
FIG. 9 is a diagram showing a snapshot table provided in the mixer constituting the audio signal processing system of the present invention.

If the setting state shown on the parameter setting window 60 of FIG. 8 has been OKed (i.e., confirmed to be OK), setting information for transmitting the marker and marker name parameters as a command is acquired at step S12. Then, in accordance with the acquired setting information, a determination is made, at step S13, as to whether a marker set command should be transmitted. Whether the marker set command should be transmitted or not is set via the parameter setting window 60 of FIG. 8, and such setting information is possessed by the mixer. If that the marker set command should be transmitted as indicated in FIG. 8 is currently set in the setting information of the mixer, a YES determination is made at step S13, and thus, the snapshot recall process branches to step S14, where the marker set command is transmitted to the PC (DAW) 6. Upon receipt of the marker set command, the PC (DAW) 6 sets a position marker into a position, corresponding to the time (time stamp) of the reception by the PC (DAW) 6 of the command, within a project being currently recorded in real time in the DAW. If, on the other hand, that the marker set command should not be transmitted is currently set in the setting information of the mixer, then a NO determination is made at step S13, so that the process proceeds to step S15. The process also proceeds to step S15 upon completion of the operation of step S14.

At step S15, a determination is made as to whether a marker name set command should be transmitted in accordance with the acquired setting information. That the marker name set command should be transmitted as indicated in FIG. 8 has been set in the setting information of the mixer, a YES determination is made at step S13, the process branches to step S14, where the marker name set command is transmitted to the PC (DAW) 6. Upon receipt of the marker name set command, the PC (DAW) 6 sets the marker name in the marker having been set in the project being currently recorded in real time. On the other hand, that the marker name set command should not be transmitted has been set in the setting information of the mixer, then a NO determination is made at step S15, so that the snapshot recall process is brought to an end. The snapshot recall process is also brought to an end upon completion of the operation of step S16.

Note that the "marker" is information indicative of a particular point or particular range within a record and means for example an editing point. The user can jump to a particular point or range within a record by following such markers during editing of the record. There are two types of markers, i.e. position marker and cycle marker. The term "marker" normally refers to a position marker indicative of a particular point, and the "cycle marker" refers to a marker setting a particular range where a loop (repetition) is to be made.

The snapshot recall process shown in FIG. 7 is started up and executed in response to a snapshot change event output at each timing when any one of an opening music piece, first music piece, second music piece, . . . , should be started. FIG. 9 shows a snapshot table for outputting a snapshot change event. As shown in FIG. 9, the snapshot table has registered therein snapshots comprising numbers (Nos.) indicative of order in which snapshot changes are to be made and snapshot names. In the illustrated example of FIG. 9, the snapshot name of No. 1 is "opening", the snapshot name of No. 2 is "MC1", the snapshot name of No. 3 is "first music piece", and the snapshot name of No. 4 is "second music piece". With the snapshot table of FIG. 9, a snapshot change event is output at each timing when any one of the opening music piece, MC1 music piece, first music piece, second music piece, . . . in accordance with the order mentioned, so that a marker set command and a marker name set command are transmitted from the mixer in response to the snapshot change event and then received by the DAW. Thus, the position marker is set into a position, corresponding to the time (time stamp) of the reception by the PC (DAW) 6 of the command, within a project being currently recorded in real time in the DAW, and simultaneously, the marker name is set for the marker. The time of the reception, by the DAW, of the command (i.e., the time when the command has been received by the DAW) corresponds to a time when a snapshot change has been made in the mixer.

Figure 10:
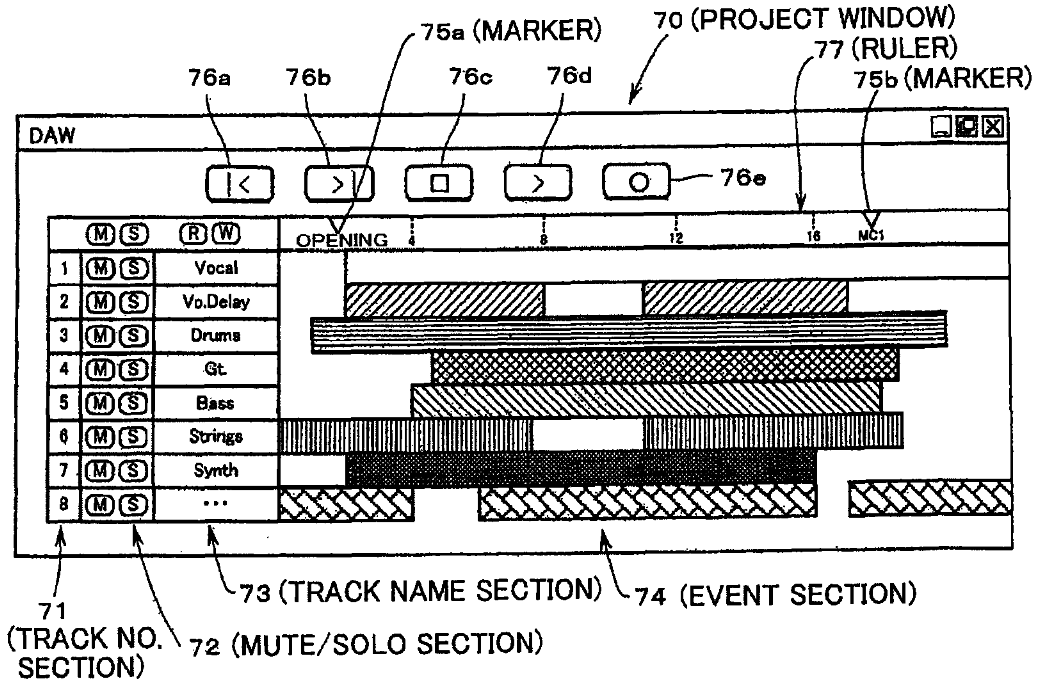
FIG. 10 is a diagram showing a project window displayed in an audio signal processing apparatus constituting the audio signal processing system of the present invention.

FIG. 10 shows an example of a project window 70 which is a screen where a position marker has been set into a position, corresponding to the time (time stamp) of reception of a command and simultaneously a marker name has been set for the marker. On the project window 70, which is displayed on a display of the PC (DAW) 6, position markers 75*a* and 75*b* are set in a ruler 77 displayed in an upper portion of the project window and indicative of a progression of a music piece. Further, on the project window 70, the marker 75*a* is set at a start position of an opening music piece, and marker name "opening" is displayed for the marker 75*a*. Further, the marker 75*b* is set at a start position of MC1, and marker name "MC1" is displayed for the marker 75*b*.

As shown in FIG. 10, eight tracks of track numbers "1", "2", . . . , "8" are also displayed on the project window, which means that the project in question comprises eight tracks. Each of the tracks comprises a horizontal row of a track number section 71, a mute/solo section 72, a track name section 73 and an event section 74. Consecutive track numbers from "1" to "8" of the eight tracks are indicated in the track number section 71, and mute ON/OFF states of the tracks and whether or not the tracks are set as a solo track are indicated in the mute/solo section 72. Further, track names of the tracks are indicated in the track name section 73, and waveform data and music piece data recorded on the tracks are indicated in the event section 74. The above-mentioned ruler 77 is provided above the event section 74. Furthermore, five transport-controlling buttons 76*a* to 76*e* are provided in an upper portion of the project window. The button 76*a* is a button for returning to a preceding marker, the button 76*b* is a button for advancing to a succeeding marker, the button 76*c* is a button for stopping reproduction or recording, the button 76*d* is a button for starting reproduction or recording, and the button 76*e* is a recording button.

Whereas the present invention has been described above in relation to the case where the mixer and the DAW are connected with each other, the number of the tracks provided in the DAW for a project to be recorded in real time need not necessarily be equal to the number of the channels in the mixer. However, it is preferable that at least the number of the tracks in the DAW be equal to the number of the channels in the mixer. Once an event is started using the mixer, the DAW starts real-time recording on all of the target tracks. In this case, the recording start may be effected manually. Then, a "marker set command" is transmitted from the mixer to the DAW software in response to a snapshot change in the mixer. Upon receipt of the marker set command, the DAW sets a position marker into a position corresponding to the time (time stamp) of reception of the marker set command. If a "marker name set command" has been transmitted simultaneously with the marker set command, then the marker name is set for the marker having been set in the DAW.

According to the present invention, in response to only a snapshot change being made in the mixer, a marker is automatically set into the DAW at the time of the snapshot change in the mixer. Thus, it is possible to eliminate the time and labor involved in marker setting operation at the time of subsequent editing. Further, because the thus-set markers are in synchronism with a progression of a live event, subsequent editing can be performed with ease.

Note that, whereas the present invention has been described above in relation to the case where the mixer transmits a marker set command and a marker name command each time one snapshot is changed to another, a marker set command and a marker name set command may be provided as separate commands, or one command for simultaneously setting both a marker and a marker name may be provided.

This application is based on, and claims priority to, JP PA 2012-010827 filed on 23 Jan. 2012. The disclosure of the priority applications, in its entirety, including the drawings, claims, and the specification thereof, are incorporated herein by reference.

What is claimed is:

1. An audio signal processing system comprising:

a mixer apparatus; and a processing apparatus configured to be communicatively connected with said mixer apparatus and having an audio recording function, said processing apparatus configured to record in real time audio signals of one or more channels output from said mixer apparatus, wherein said mixer apparatus is configured to transmit, to said processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, and said processing apparatus is configured to, upon receipt of the command, set the given parameter, instructed by the received command, into a project that is recording in real time the audio signals of one or more channels.

2. The audio signal processing system as claimed in claim 1, wherein said mixer apparatus is configured to make, based on user's operation, a setting as to whether or not the command should be transmitted, in response to a snapshot change for collectively changing a state of a set of signal-processing setting data, said set of signal-processing setting data including a plurality of signal processing parameters, said given parameter different in type from said plurality of signal processing parameters.

3. The audio signal processing system as claimed in claim 2, wherein said mixer apparatus is configured to transmit, for each of one or more types of parameters, the command and configured to make, based on user's operation, a setting as to whether or not the command should be transmitted.

4. The audio signal processing system as claimed in claim 1, wherein said processing apparatus is configured to record the given parameter, corresponding to the command, into a record of the project.

5. The audio signal processing system as claimed in claim 4, wherein said processing apparatus is configured to record the given parameter into a position, corresponding to a time of reception of the command, within the record of the project.

6. The audio signal processing system as claimed in claim 1, wherein the given parameter is at least one of a marker and a marker name.

7. A recording method for use in an audio signal processing system, the audio signal processing system comprising: a mixer apparatus; and a processing apparatus communicatively connected with the mixer apparatus and having an audio recording function, the processing apparatus being configured to record in real time audio signals of one or more channels output from said mixer apparatus, said recording method comprising:

transmitting by the mixer apparatus, to the processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, and setting by the processing apparatus, upon receipt of the command, the given parameter, instructed by the received command, into a project that is recording in real time the audio signals of one or more channels.

8. A mixer apparatus configured to be communicatively connected with a processing apparatus having an audio recording function, said processing apparatus configured to record in real time audio signals of one or more channels output from said mixer apparatus, said mixer apparatus comprising:

a communication interface for performing communication with the processing apparatus; and a processor configured to transmit via the communication interface, to said processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, wherein the given parameter, instructed by the command transmitted by the processor of said mixer apparatus, is to be set into a project that is recording in real time the audio signals of one or more channels in said processing apparatus.

9. A command transmission method for use in a mixer apparatus communicatively connected with a processing apparatus having an audio recording function, the processing apparatus configured to record in real time audio signals of one or more channels output from the mixer apparatus, said command transmission method comprising:

transmitting by said mixer apparatus, to the processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, wherein the given parameter, instructed by the command transmitted by the mixer apparatus, is to be set into a project that is recording in real time the audio signals of one or more channels in the processing apparatus.

10. A non-transitory computer-readable storage medium containing a program for causing a processor to perform a command transmission method in a mixer apparatus communicatively connected with a processing apparatus having an audio recording function, the processing apparatus being configured to record in real time audio signals of one or more channels output from the mixer apparatus, said command transmission method comprising:

transmitting, from said mixer apparatus to the processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, wherein the given parameter, instructed by the command transmitted by the mixer apparatus, is to be set into a project that is recording in real time the audio signals of one or more channels in the processing apparatus.

11. An audio signal processing apparatus configured to be communicatively connected with a mixer apparatus and having an audio recording function, the mixer apparatus being configured to transmit, to said processing apparatus, a command for setting a given parameter, in response to a snapshot change in the mixer apparatus for collectively changing a state of a set of signal-processing setting data said set of signal-processing setting data including a plurality of signal processing parameters, said given parameter different in type from said plurality of signal processing parameters, said audio signal processing apparatus comprising:

a module for recording in real time audio signals of one or more channels output from the mixer apparatus; and a module for, upon receipt of the command, setting the given parameter, instructed by the received command, into a project that is recording in real time the audio signals of one or more channels.

12. A recording method for use in an audio signal processing apparatus communicatively connected with a mixer apparatus, the mixer apparatus being configured to transmit, to the processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, said recording method comprising:

recording in real time audio signals of one or more channels output from the mixer apparatus; and setting, upon receipt of the command, the given parameter, instructed by the received command, into a project that is recording in real time the audio signals of one or more channels.

13. A non-transitory computer-readable storage medium containing a program for causing a processor to perform a recording method in an audio signal processing apparatus communicatively connected with a mixer apparatus, the mixer apparatus being configured to transmit, to the processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, said recording method comprising:

recording in real time audio signals of one or more channels output from the mixer apparatus; and setting, upon receipt of the command, the given parameter, instructed by the received command, into a project that is recording in real time the audio signals of one or more channels.

14. An audio signal processing apparatus configured to be communicatively connected with a mixer apparatus and having an audio recording function, the mixer apparatus being configured to transmit, to said processing apparatus, a command for setting a given parameter, in response to a snapshot change in the mixer apparatus for collectively changing a state of a set of signal-processing setting data, said set of signal-processing setting data including a plurality of signal processing parameters, said given parameter different in type from said plurality of signal processing parameters, said audio signal processing apparatus comprising:

a digital audio workstation (DAW) comprising:

an I/O terminal for connection to the mixer apparatus via an audio network; and a display for displaying a project window, wherein the DAW is configured to record in real time audio signals of one or more channels output from the mixer apparatus to said audio signal processing apparatus via the audio network, and wherein the DAW is configured to set, upon receipt of the command, the given parameter, instructed by the received command, into a project that is recording in real time the audio signals of one or more channels, the given parameter to be set into a position on the project window.

* * * * *